(12) United States Patent
Jeong

(10) Patent No.: US 7,292,088 B2
(45) Date of Patent: Nov. 6, 2007

(54) GATE DRIVER OUTPUT STAGE WITH BIAS CIRCUIT FOR HIGH AND WIDE OPERATING VOLTAGE RANGE

(75) Inventor: Jong-Deog Jeong, Rancho Palos Verdes, CA (US)

(73) Assignee: International Rectifier Corporation, El Segundo, CA (US)

( * ) Notice: Subject to any disclaimer, the term of this patent is extended or adjusted under 35 U.S.C. 154(b) by 16 days.

(21) Appl. No.: 11/130,370

(22) Filed: May 16, 2005

(65) Prior Publication Data

US 2005/0258495 A1   Nov. 24, 2005

Related U.S. Application Data

(60) Provisional application No. 60/572,674, filed on May 19, 2004.

(51) Int. Cl.
*H03K 17/687* (2006.01)

(52) U.S. Cl. ...................... 327/437; 327/434

(58) Field of Classification Search .............. 327/156, 327/540, 563, 434, 437; 323/273, 281
See application file for complete search history.

(56) References Cited

U.S. PATENT DOCUMENTS

| | | | | |
|---|---|---|---|---|
| 5,717,345 | A * | 2/1998 | Yokomizo et al. | 326/80 |
| 5,886,570 | A * | 3/1999 | Brokaw | 327/540 |
| 6,605,973 | B1 * | 8/2003 | Chih | 327/309 |
| 6,713,993 | B2 * | 3/2004 | Descombes | 323/273 |
| 6,777,991 | B2 * | 8/2004 | Murakami | 327/156 |

* cited by examiner

*Primary Examiner*—Dinh T. Le
(74) *Attorney, Agent, or Firm*—Ostrolenk, Faber, Gerb & Soffen, LLP

(57) ABSTRACT

A simple, low cost, gate driver and bias circuit provides for a wider operating voltage range exceeding the normal component breakdown voltage of components such as NMOS and PMOS transistors. A CMOS process with an epitaxial layer as bulk and p-type substrate is used to implement the circuit in this example.

11 Claims, 4 Drawing Sheets

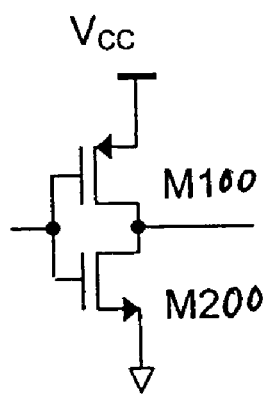 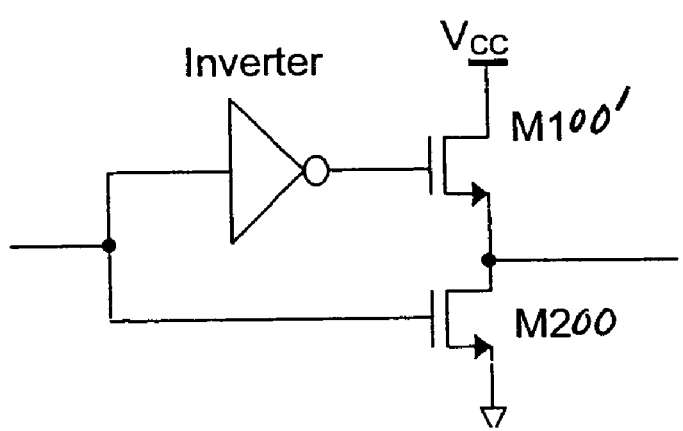
Fig. 1
PRIOR ART
Fig. 2
PRIOR ART

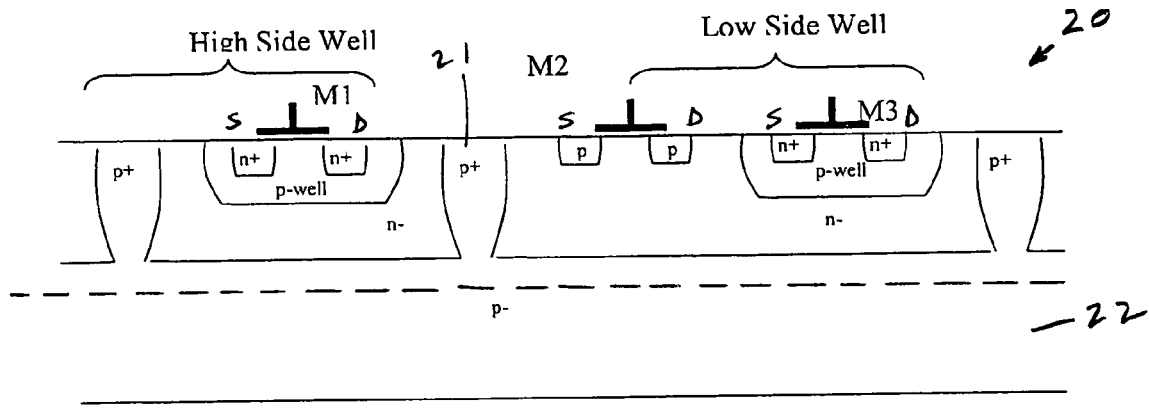
FIG. 3
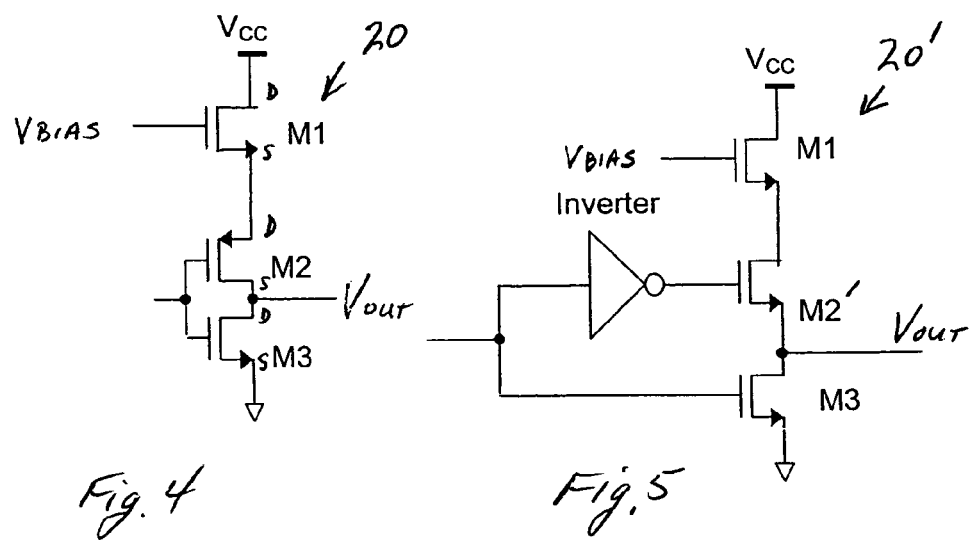
Fig. 4
Fig. 5

GATE DRIVER OUTPUT STAGE WITH BIAS CIRCUIT FOR HIGH AND WIDE OPERATING VOLTAGE RANGE

CROSS REFERENCE TO A RELATED APPLICATION

The present application is based upon and claims priority of Provisional Application Ser. No. 60/572,674 filed May 19, 2004, incorporated by reference in its entirety.

BACKGROUND OF THE INVENTION

1. Field of the Invention

The invention relates to a circuit for driving the gate of a MOSFET or IGBT, and more particularly to an integrated gate driver output stage with a bias circuit which provides a high and wide operating voltage range.

2. Related Art

FIG. 1 shows a conventional CMOS push-pull output stage comprising MOSFETs M100 and M200 for driving the gate of a discrete MOSFET or IGBT.

FIG. 2 shows a conventional NMOS totem pole output stage comprising MOSFETs M100' and M200 for driving the gate of a discrete MOSFET or IGBT.

The maximum operating voltages of the circuits in FIG. 1 and FIG. 2 are determined by the respective voltage differences between the drain and source nodes of M100 and M200, or M100' and M200. If the voltage difference across one of these MOSFETs is higher than the maximum drain-source breakdown voltage of the IC device, breakdown occurs, causing the output driver to lose its functionality.

SUMMARY OF THE INVENTION

To address this issue, the invention provides a gate driver that can operate at a higher voltage than the normal maximum voltage rating of its IC devices, and over a wider voltage range.

It also provides a gate driver having a variable output voltage that can be set by an integrated bias circuit.

Also provided is a bias circuit for a gate driver.

One aspect of the invention relates to an output stage for a drive circuit comprising: first and second semiconductor devices each having a respective pair of main terminals, one main terminal of each of said devices being connected in series to form a half-bridge, an output drive signal being supplied at said connection point, each device further having a respective control terminal, said control terminals being connected together to receive a control signal; and a third semiconductor device having one main terminal which receives a supply voltage, another main terminal connected in series with said first device, and a control terminal for receiving a bias voltage, said third device being controllable by said bias voltage for variably reducing said supply voltage to prevent said supply voltage from being fully applied to said first and second devices. The devices are advantageously integrated in a semiconductor chip, with said first and second devices being formed in a low-side well and said third device being formed in a high-side well of said chip.

According to another aspect of the invention, a bias circuit may be integrated in said semiconductor chip, the bias circuit comprising: a fourth semiconductor device having a first main terminal which receives said supply voltage and a second main terminal which supplies said bias voltage to said control terminal of said third device; a voltage divider connected at one end to said third device control terminal and at another end to a common point; an error amplifier having a positive input receiving an output of said voltage divider and a negative input receiving a reference voltage referenced to said common point; said error amplifier having an output driving a control terminal of a fifth semiconductor device, one main terminal of said fifth device being connected to a control terminal of said fourth device, the other main terminal of said fifth device being connected to said common point; and a resistance connected between said supply voltage input and the control terminal of said fourth device. The bias circuit generates a bias voltage determined by the equation:

$$V_{BIAS} = \frac{R_2}{R_1 + R_2} \cdot V_{REF}$$

wherein $V_{REF}$ is said reference voltage, and $R_1$ and $R_2$ are two resistances of said voltage divider. The error amplifier may comprise an op-amp or a comparator, for example.

A further aspect of the invention relates to a method for increasing the operating voltage range of an output stage of a drive circuit, said output stage comprising: first and second semiconductor devices each having a respective pair of main terminals, one main terminal of each of said devices being connected in series to form a half-bridge, an output drive signal being supplied at said connection point, each device further having a respective control terminal, said control terminals being connected together to receive a control signal. The method comprises the steps of: providing a third semiconductor device having one main terminal which receives a supply voltage for said output stage, another main terminal connected in series with said first device, and a control terminal for receiving a bias voltage; and controlling said third device by adjusting said bias voltage, for variably reducing said supply voltage to prevent said supply voltage from filly being applied to said first and second devices. The step of adjusting said bias voltage may thereby adjust a voltage drop across said third device. The step of adjusting said bias voltage may also thereby adjust a voltage of said output drive signal.

The present invention provides a simple, low cost, gate driver and bias circuit having a higher component breakdown voltage than in conventional CMOS, NMOS and PMOS arrangements and a wider operating voltage range. A CMOS device with an epitaxial layer on a p-type substrate may be used to implement the circuit.

Other features and advantages of the present invention will become apparent from the following description of embodiments of the invention which refers to the accompanying drawings.

BRIEF DESCRIPTION OF THE DRAWINGS

FIG. 1 shows a conventional CMOS push-pull output stage for driving the gate of a discrete MOSFET or IGBT;

FIG. 2 shows a conventional NMOS totem pole output stage for driving the gate of a discrete MOSFET or IGBT;

FIG. 3 shows a first embodiment of the invention comprising a CMOS device with an epitaxial layer as a bulk layer formed on a p-type substrate;

FIG. 4 is a schematic diagram of a CMOS push-pull output stage corresponding to the embodiment of FIG. 3;

FIG. 5 is a schematic diagram of an NMOS totem pole output stage according to a second embodiment of the invention;

DETAILED DESCRIPTION OF EMBODIMENTS OF THE INVENTION

FIG. 3 shows a first embodiment of the invention including a CMOS device 20 with an epitaxial layer 21 formed on a p-type substrate 22. Integrated MOSFETs M1, M2 and M3 in FIG. 3 correspond to the same elements shown schematically in FIG. 4.

The top transistor M1 in FIGS. 4 and 5 is connected in series with the output transistors M2 (M2') and M3 and provides a variable voltage drop according to the applied bias voltage. It thereby keeps the drain voltage of the middle transistor M2 (M2') lower than the breakdown voltage even when the supply voltage $V_{CC}$ is higher than the breakdown voltage. Moreover, by varying the voltage drop across M1, the output voltage $V_{OUT}$ can also be adjusted.

As seen in FIG. 3, M1 is in the high side well to isolate it from M2 and M3 which are in the low side well. M1 is placed in the high side well since the voltage difference $V_{CC}$ is applied between M1 and the epitaxial layer 21. Isolating M1 from the other transistors ensures that $V_{CC}$ will not be applied to the transistors M2 and M3.

Figure 6:
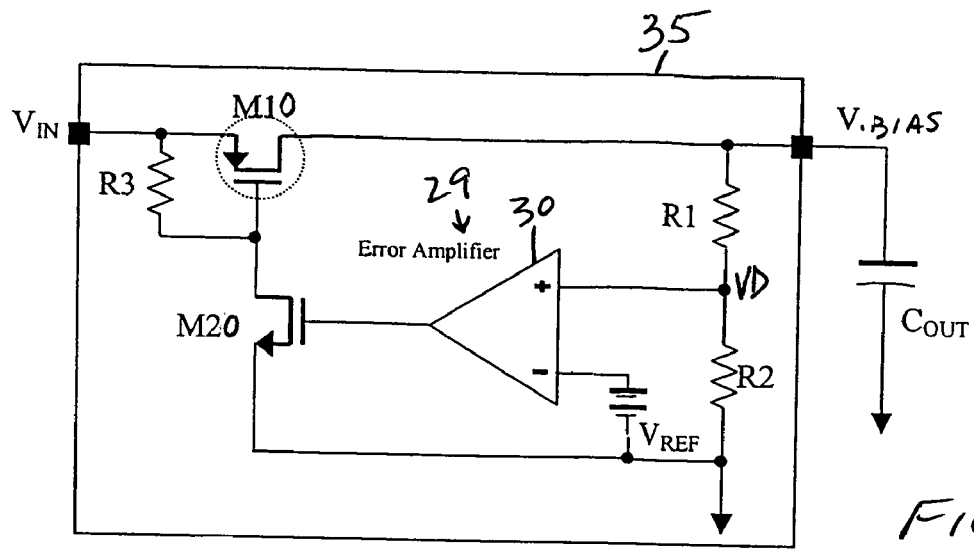
FIG. 6 is a schematic diagram of a bias circuit including an op-amp.
Figure 7:
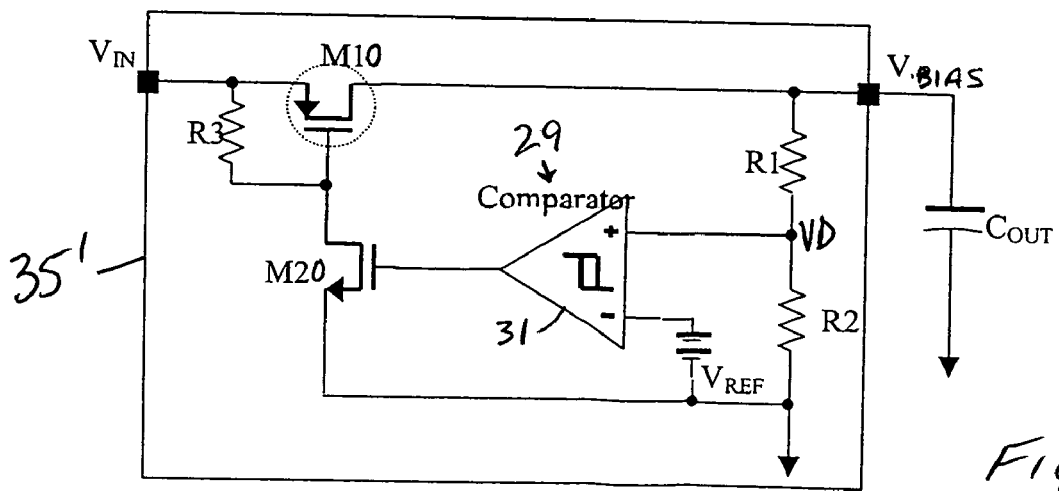
FIG. 7 is a schematic diagram of a bias circuit including a comparator.

The circuits in FIGS. 4 and 5 to operate properly need a controlled bias voltage $V_{BIAS}$ on the gate of M1. The gate bias voltage can be generated by many topologies. FIGS. 6 and 7 show two possible examples 35 and 35'. This topology has the advantage when the voltage difference between $V_{CC}$ ($V_{IN}$) and $V_{BIAS}$ is very small. Other topologies may be used when $V_{CC}$ is lower than $V_{BIAS}$ or slightly higher than $V_{BIAS}$.

In FIGS. 6 and 7, an error amplifier 29 (op-amp 30 in FIG. 6, comparator 31 in FIG. 7), receives a reference voltage $V_{REF}$ at its negative input, and at its positive input receives the voltage VD at the midpoint of a voltage divider R1, R2. When VD>$V_{REF}$, the error amplifier 29 turns on a switching device M20 of one conductivity type. A first main terminal of the switching device M20 is grounded, and the second is connected to a control terminal of another switching device M10 of the conductivity type opposite to that of M20. The two main terminals of M10 are connected respectively to the supply voltage $V_{IN}$ ($V_{CC}$) and the $V_{BIAS}$ output terminal. A resistor R3 is connected between $V_{IN}$ and the control terminal of M10.

M10 and R3 in FIGS. 6 and 7 are located in the high side well, in the same fashion as M1 in FIGS. 4 and 5. The output voltage $V_{BIAS}$ is determined by equation (1) below.

$$V_{BIAS} = \frac{R_2}{R_1 + R_2} \cdot V_{REF} \quad (1)$$

Figure 8:
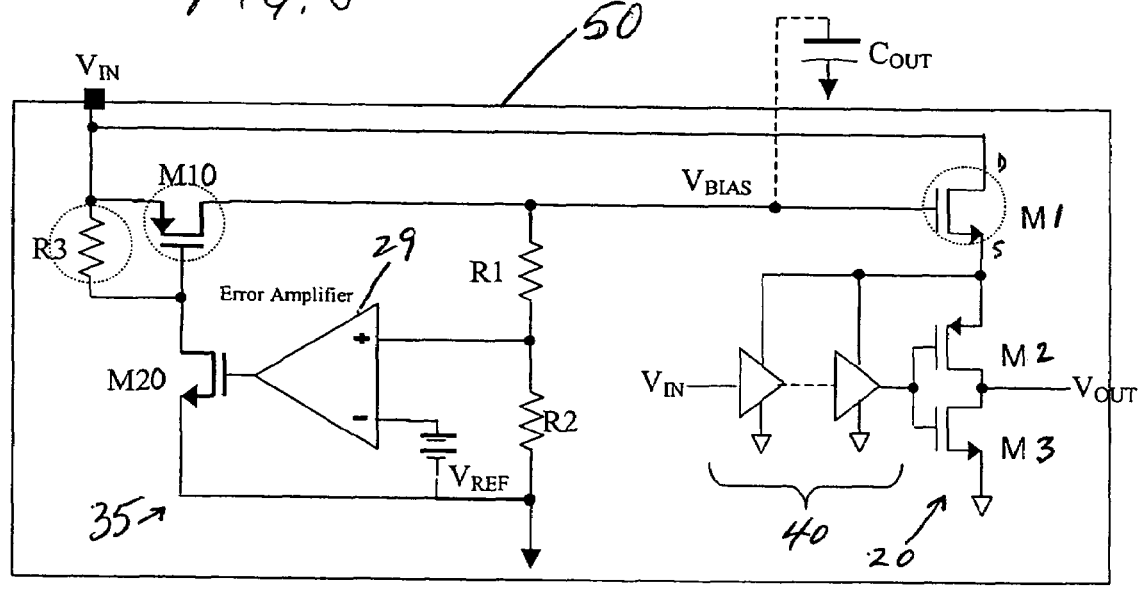
FIG. 8 is a schematic diagram of a gate driver circuit including the push-pull driver of FIG. 4 and the bias circuit of FIG. 6.

FIG. 8 shows an integrated gate driver circuit 50 including the push-pull driver of FIG. 4 and the bias circuit of FIG. 6. Also seen is control circuitry 40 for supplying control signals to the output circuit 20 as needed for a particular application. If M10, M1, and R3 are in the high side well in FIG. 5, and $V_{BIAS}$ is set at $V_{CC}/2$ by R1 and R2, then the voltage $V_{OUT}$ has a range from 0 to $V_{CC}/2$, so that a voltage $V_{IN}$ which is twice as high as the normal maximum operating voltage can be applied. The threshold voltage of M1 is neglected because it is small compared to $V_{CC}$. $C_{OUT}$ may maintain the level of $V_{BIAS}$ and may also ground any high-frequency transients that occur. $C_{OUT}$ may be implemented internally or outside the IC. Whether the circuit will operate reliably without $C_{OUT}$ and the value of $C_{OUT}$ can be determined by routine experimentation.

Advantages of using the circuit topologies described above are that (1) the chip size is reduced because the size of a component such as a MOSFET is proportional to its maximum voltage rating, (2) cost savings are achieved due to the smaller chip size, (3) the operating voltage range is wider than in conventional circuits, and (4) fast response time is easily achieved due to the small component size and the other features disclosed.

Although NMOS and CMOS components are used as examples in this disclosure, PMOS components could also be used with suitable circuit modifications.

Although the present invention has been described in relation to particular embodiments thereof, many other variations and modifications and other uses will become apparent to those skilled in the art. Therefore, the present invention is not limited by the specific disclosure herein.

What is claimed is:

1. An output stage for a drive circuit comprising:

first and second semiconductor devices each having a respective pair of main terminals, one main terminal of each of said devices being connected in series to form a half-bridge, an output drive signal being supplied at said connection point, each device further having a respective control terminal, said control terminals being connected together to receive a control signal;

a third semiconductor device having one main terminal which receives a supply voltage, another main terminal connected in series with said first device, and a control terminal for receiving a bias voltage, said third device providing a voltage drop according to said bias voltage to prevent said supply voltage from being fully applied to said first and second devices;

wherein said first, second and third devices are integrated in a semiconductor chip; and wherein said first and second devices are formed in a low-side well and said third device is formed in a high-side well of said chip.

2. An output stage for a drive circuit according to claim 1, wherein said devices are formed in an epitaxial layer of a first conductivity type which is formed on a substrate also of said first conductivity type.

3. An output stage for a drive circuit according to claim 1, wherein said first and second devices are of complementary conductivity types, and said first and third devices are of complementary conductivity types.

4. An output stage for a drive circuit according to claim 1, wherein said first and second devices are of the same conductivity type.

5. An output stage for a drive circuit according to claim 4, wherein said third device is also of said same conductivity type.

6. An output stage for a drive circuit according to claim 1, further comprising a bias circuit integrated in said semiconductor chip, comprising:

a fourth semiconductor device having a first main terminal which receives said supply voltage and a second main terminal which supplies said bias voltage to said control terminal of said third device;

a voltage divider connected at one end to said third device control terminal and at another end to a common point;

an error amplifier having a positive input receiving an output of said voltage divider and a negative input receiving a reference voltage referenced to said common point;

said error amplifier having an output driving a control terminal of a fifth semiconductor device, one main terminal of said fifth device being connected to a control terminal of said fourth device, the other main terminal of said fifth device being connected to said common point; and a resistance connected between said supply voltage input and the control terminal of said fourth device.

7. An output stage for a drive circuit according to claim 6, wherein said bias circuit generates a bias voltage determined by the equation:

$$V_{BIAS} = \frac{R_2}{R_1 + R_2} \cdot V_{REF}$$

wherein $V_{REF}$ is said reference voltage, and R1 and R2 are two resistances of said voltage divider.

8. An output stage for a drive circuit according to claim 6, wherein the other main terminal of said second semiconductor device is connected directly to said common point.

9. An output stage for a drive circuit according to claim 1, wherein said second and third devices are of the same conductivity type.

10. An output stage for a drive circuit according to claim 1, wherein said first and second devices have a predetermined safe voltage, and said voltage drop reduces said supply voltage so that said first and second devices receive no more than said predetermined safe voltage.

11. An output stage for a drive circuit according to claim 1, wherein said bias voltage is referenced to a common point, and the other main terminal of said second semiconductor device is connected directly to said common point.

* * * * *